(12) United States Patent
Maheshwari

(10) Patent No.: US 7,324,362 B1
(45) Date of Patent: Jan. 29, 2008

(54) CONTENT ADDRESSABLE MEMORY CELL CONFIGURABLE BETWEEN MULTIPLE MODES AND METHOD THEREFOR

(75) Inventor: Dinesh Maheshwari, Fremont, CA (US)

(73) Assignee: Netlogic Microsystems Inc., Mountain View, CA (US)

( * ) Notice: Subject to any disclaimer, the term of this patent is extended or adjusted under 35 U.S.C. 154(b) by 0 days.

(21) Appl. No.: 11/366,040

(22) Filed: Mar. 1, 2006

Related U.S. Application Data (60) Provisional application No. 60/657,754, filed on Mar. 1, 2005.

(51) Int. Cl.
G11C 15/00 (2006.01)
(52) U.S. Cl. .......................... 365/49; 365/190
(58) Field of Classification Search .................. 365/49, 365/190
See application file for complete search history.

(56) References Cited

U.S. PATENT DOCUMENTS

| | | | |
|---|---|---|---|
| 4,523,301 A | 6/1985 | Kadota et al. | |
| 4,646,271 A | 2/1987 | Uchiyama et al. | |
| 4,845,668 A | 7/1989 | Sano et al. | |
| 5,339,268 A | 8/1994 | Machida | |
| 6,108,227 A | 8/2000 | Voelkel | |
| 6,266,262 B1 | 7/2001 | Washburn et al. | |
| 6,505,270 B1 | 1/2003 | Voelkel et al. | |
| 6,564,289 B2 | 5/2003 | Srinivasan et al. | |
| 6,944,039 B1* | 9/2005 | Nataraj et al. | 365/49 |
| 7,133,302 B1* | 11/2006 | Srinivasan et al. | 365/49 |
| 2004/0223353 A1* | 11/2004 | Kim et al. | 365/49 |
| 2005/0213359 A1* | 9/2005 | Kim | 365/49 |
| 2006/0239054 A1* | 10/2006 | McKenzie et al. | 365/49 |
| 2006/0250833 A1* | 11/2006 | Sachan | 365/49 |
| 2006/0262583 A1* | 11/2006 | Venkatachary | 365/49 |

* cited by examiner

*Primary Examiner*—Michael T Tran
(74) *Attorney, Agent, or Firm*—Haverstock & Owens, LLP (57) ABSTRACT

A CAM cell (200) can include a compare section (206) and a configuration section (208). In a binary mode of operation, two compare data values can be driven on value lines VL1 to VL4 (216-0 to 216-3) for comparison against two stored data values. In a ternary mode of operation, one compare data value can driven on two of the value lines, while the other two value lines can be forced to a potential unrelated to a compare data value allowing for dynamic configuration between binary and ternary modes of operation.

19 Claims, 8 Drawing Sheets

CONTENT ADDRESSABLE MEMORY CELL CONFIGURABLE BETWEEN MULTIPLE MODES AND METHOD THEREFOR

This application claims the benefit of U.S. Provisional Patent Application Ser. No. 60/657,754, filed Mar. 1, 2005, the contents of which are incorporated by reference herein.

TECHNICAL FIELD

The present invention relates generally to memory devices, and more particularly to a content addressable memory (CAM) cell that is configurable between different modes of operation, including binary and ternary modes.

BACKGROUND OF THE INVENTION

Conventional content addressable memories (CAMs) can provide rapid matching between a specific pattern of received data bits, commonly known as a search key or comparand, and data values stored in a content addressable memory (CAM) array. In a CAM device, a CAM array can be searched in parallel. If a match occurs between each bit of a stored data value and a corresponding bit of an applied comparand, a match indication can be generated, via a match line, to indicate that the applied comparand is stored in the CAM. Data associated with the matching CAM location can then be returned. Thus, in a CAM device, a result can be determined from finding a matching value (content), and not from an address for a value, as is typically done for a random access memory (RAM).

Conventional CAM cells can include binary CAM cells as well as ternary CAM cells.

A conventional binary CAM cell can store a data bit value (i.e., logic "0", or logic "1"). When such a stored data bit value matches an applied compare data bit value, the binary CAM cell can maintain a high impedance between a precharged match line, and a lower discharge potential. If all binary CAM cells connected to a given match line provide a match result, the match line can maintain the precharged state, indicating a match result. When a stored data bit value does not match an applied compare data bit value, the binary CAM cell can provide a low impedance between a precharged match line and lower discharge potential. Thus, if any one of the binary CAM cells connected to a given match line provides a no match result, the match line will be discharged, indicating a no match (miss) result for the comparand.

A conventional ternary CAM (TCAM) cell can store three states, including a logic "0"), logic "1" and a "don't care". When such a TCAM cell stores a logic "0" or logic "1", the TCAM cell can provide the same essential match operation as a binary CAM cell. However, when such a TCAM cell stores a "don't care" value, the TCAM cell can provide a match result regardless of the compare data value applied to the TCAM cell.

In addition, to reduce the size of a TCAM system or device, it is often desirable to map mask to data entries in the form of a 1:N mapping. A mapping of 1:1 can identify a "full" TCAM. A mapping of 1:N, where N>1, can identify a pseudo-TCAM.

Among the numerous applications for memory systems using CAM devices or systems are network search engines (NSEs). NSEs can use TCAMs to provide fast searches of a database, list, or pattern. Binary CAMs can be used, for example, to implement media access control (MAC) tables, while TCAMs can be used to implement forwarding information base (FIB) and/or access control list (ACL) tables.

Figure 9:
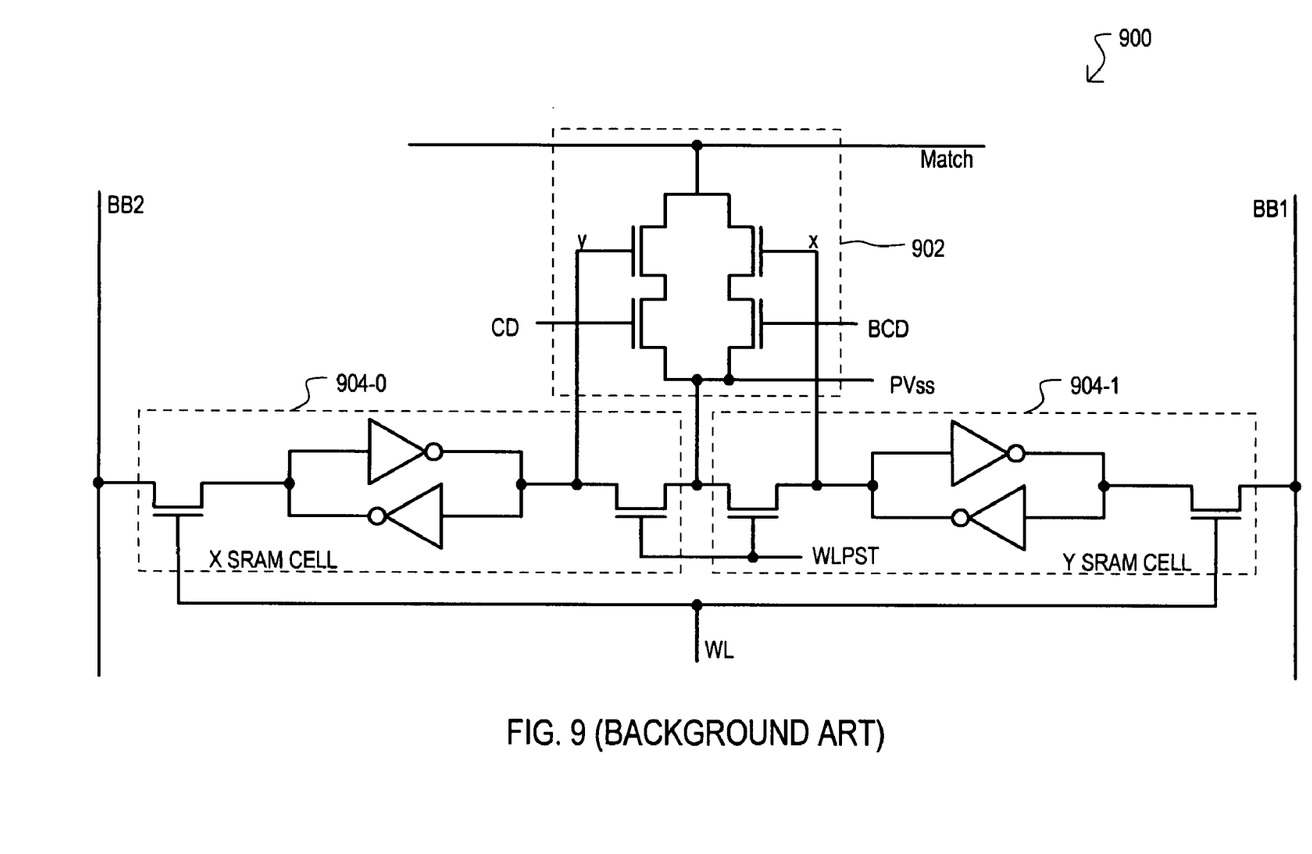
FIG. 9 is a schematic diagram of a conventional ternary CAM cell.

A schematic diagram of a conventional "X/Y" type TCAM cell is shown in FIG. 9. Referring to FIG. 9, a single conventional TCAM cell 900 generally includes a "stack" 902 and two static random access memory (SRAM) cells 904-0 and 904-1. In the particular arrangement of FIG. 9, SRAM cells (904-0 and 904-1) can store data bits (referred typically as an X-value and Y-value) to be compared by transistors within stack 902 against externally supplied comparand data provided at inputs CD and BCD. An input CD can provide a compare data value, while input BCD can provide a complementary compare data value (compare data "bar"). That is CD and BCD are complementary values with respect to each other. The stack 902 of FIG. 9 includes four N-type metal-oxide-semiconductor (MOS) transistors. Other conventional stacks can include more such transistors.

FIG. 9 shows an "X/Y" type TCAM cell. In such an arrangement, a masking value (don't care) is determined according to a data value stored in both SRAM cells (904-0 and 904-1). This is in contrast to a "V/M" type TCAM cell in which a masking value is determined according to one data value (e.g., M) stored in a single SRAM cell.

Conventional TCAM cells like that of FIG. 9 can suffer from a number of drawbacks. First, while such cells can be configured for binary operation (forcing the cell to a state other than don't care), such an approach can be wasteful, as two storage bits are dedicated to represents essentially one bit value. Further, conventional TCAM cells cannot be dynamically reconfigured in the field to be optimized for density depending upon a binary or ternary configuration. That is, to configure a conventional TCAM cell to operate as a binary CAM cell can require a write operation to one or both SRAM cells in such a circuit.

In light of the above, it would be desirable to arrive at a TCAM cell that can be dynamically reconfigurable between binary and ternary modes of operation. It would also be desirable for a device including such TCAM cells to support bit-wise maskable writes, as well as parallel mask writes to multiple location to emulate pseudo-ternary cell operations. Bit-wise maskable writes can be writes to multiple bit locations of a same column, as opposed to conventional row-wise writes. Still further, it is almost always desirable to arrive at circuit implementations that are compact relative to conventional approaches.

DETAILED DESCRIPTION

The present invention is directed to content addressable memories (CAMs), and more particularly to a CAM cell circuit having a dynamically configurable binary/ternary architecture.

According to an embodiment, a ternary CAM (TCAM) cell circuit can include a pair of memory cells and an operation stack. An operation stack can include a first section arranged to provide a match stack (or discharge stack) that can transfer charge between a match line and some predetermine potential. An operation stack can also include a second section that can configure the TCAM cell circuit between binary and ternary modes of operation. Preferably, some portion of the second section can operate in conjunction with the match stack in a compare operation.

In one very particular embodiment, memory cells can include static random access memory (SRAM) cells. Further, a match stack can be formed by one or more paths formed by single transistors. This can reduce discharge time, and hence improve speed of a TCAM cell in a match operation.

Various more detailed embodiments of the present invention will now be described in detail with reference to a number of drawings.

Figure 1:
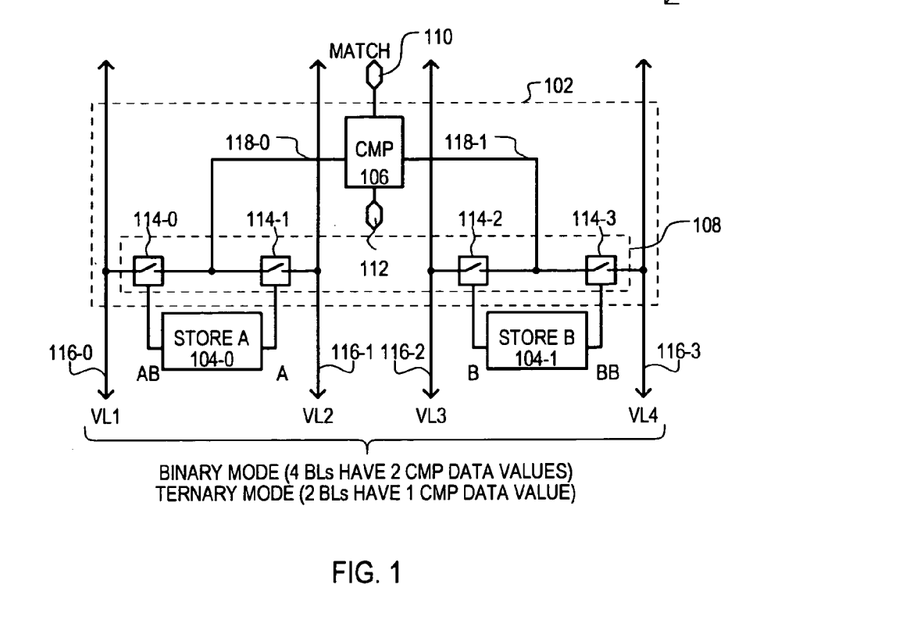
FIG. 1 is a block schematic diagram of a configurable content addressable memory (CAM) cell according to a first embodiment.

A configurable CAM cell circuit according to a first embodiment is set forth in FIG. 1, and designated by the general reference character 100. A TCAM cell circuit 100 can include a stack section 102, a first storage cell 1040 and a second storage cell 104-1. A stack section 102 can include a compare section 106 and a configuration section 108.

A compare section 106 can provide an impedance path between a match node 110 and a reference node 112. Prior to the application of compare data, a potential difference can be established between match node 110 and reference node 112. In response to the application of compare data, compare section 106 can provide either a high impedance or a low impedance between match line node 110 and potential node 112. One match result (e.g., either HIT or MISS) can be generated in response to charge transferring between match node 110 and reference node 112, while another match result (e.g., either MISS or HIT) can be generated by essentially no charge transfer between a match node 110 and a reference node 112.

A configuration section 108 can operate to enable binary or ternary modes of operation. In a binary mode of operation, a TCAM cell 100 can provide binary compare operations between two stored data values and two applied compare data values. In a ternary mode of operation, a TCAM cell 100 can provide a ternary compare operation between a maskable stored value and an applied compare data value. In the particular example of FIG. 1, a configuration section 108 can include first through fourth switch elements 114-0 to 114-3. A first switch element 114-0 can provide a controllable impedance path between a first data value line VL1 116-0 and a first compare input 118-0 to compare section 106. A second switch element 114-1 can provide a controllable impedance path between a second data value line VL2 116-1 and first compare input 118-0. In a similar fashion, a third switch element 114-2 can provide a controllable impedance path between a third data value line VL3 116-2 and a second compare input 118-1 to compare section 106. A fourth switch element 114-3 can provide a controllable impedance path between a fourth data value line VL4 116-3 and second compare input 118-1. First and second switch elements (114-0 and 114-1) can be enabled according to complementary data values A and AB provided by first storage cell 104-0. Third and fourth switch elements (114-2 and 114-3) can be enabled according to complementary data values B and BB provided by second storage cell 104-1.

A first storage cell 104-0 and a second storage cell 104-1 can store data bit values for comparison to one or more applied comparand values in a compare operation. In particular, in a binary mode of operation, a first storage cell 104-0 can store a data value for comparison with a first applied compare data value. Further, a second storage cell 104-1 can store a data value for comparison with a second applied compare data value. In a ternary mode of operation, a first and second storage cells (104-0 and 104-1) can store two data bit values that can represent three possible ternary states ("0", "1" and "don't care").

Dynamic switching between ternary and binary modes of operation can be accomplished according to the application of values on data value lines VL1 to VL4 (116-0 and 116-1). In particular, in a binary mode of operation, a first (binary) compare data value can be driven on two of the data value lines (selected of 116-0 to 116-3). Further, a second (binary) compare data value can be driven on another two of data value lines (116-0 to 116-3). In a ternary node of operation, a (ternary) compare data value can be driven on two of data value lines (selected of 116-0 to 116-3), while the remaining data value lines can be driven to a predetermined data values. The predetermined data values do not correspond to any compare data value.

In this way, a particular mode of operation (e.g., binary or ternary) can be established according to values driven on data value lines. This can allow for dynamic switching between ternary and binary modes of operation, where such switching does not require the writing of a data value.

Figure 2:
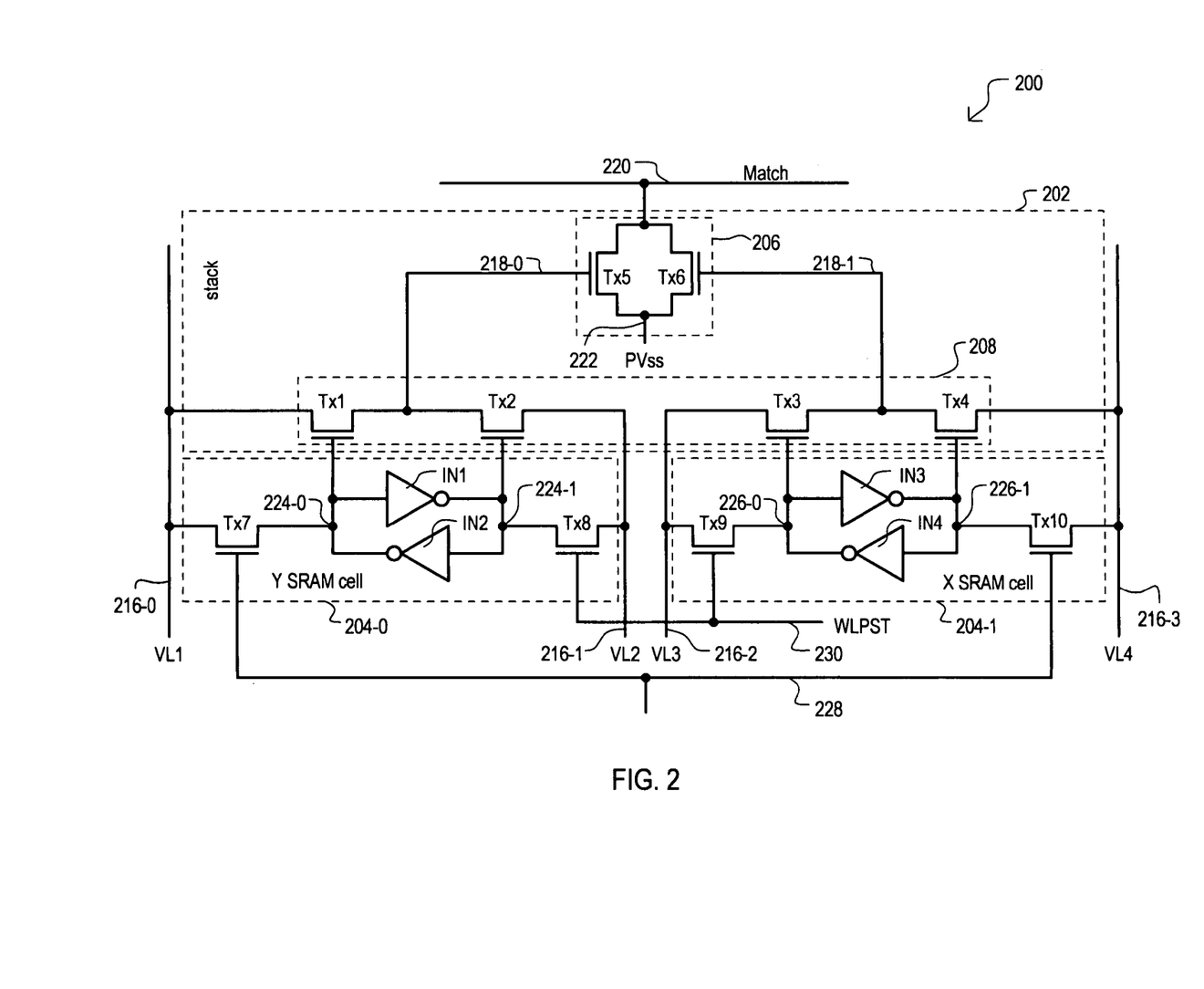
FIG. 2 is a schematic diagram of a configurable CAM cell according to a second embodiment.

A schematic diagram of a dynamically configurable binary/ternary X/Y CAM cell according to a second embodiment is shown in FIG. 2, and designated by the general reference character 200. A CAM cell 200 can provide either binary or ternary encoding. A binary encoding example is shown in Table I. A ternary encoding example is shown in Table II.

TABLE I

| X/Y | Value |
|---|---|
| 1 | 1 |
| 0 | 0 |

TABLE II

| X | Y | Value |
|---|---|---|
| 1 | 0 | 0 |
| 0 | 1 | 1 |
| 0 | 0 | 0/1 (don't care) |

Referring still to FIG. 2, a CAM cell 200 can include a stack 202, a first storage cell 204-0, and a second storage cell 204-1. A stack 202 can include a compare section 206 and a configuration section 208. A compare section 206 can include controllable impedance paths Tx5 and Tx6 arranged in parallel with each other. One path (Tx5) can be controlled according to a first compare input 218-0, while the other path (Tx6) can be controlled according to another compare input 218-1. In the very particular example of FIG. 2, impedance path Tx5 can include an n-channel insulated gate field effect transistor (referred to herein as NFET) having a drain coupled to a match line 220, a source coupled to a discharge node 222, and a gate coupled to compare input 218-0. An impedance path Tx6 can include an NFET having a drain coupled to a match line 220, a source coupled to a discharge node 222, and a gate coupled to compare input 218-1.

In one embodiment, a discharge node 222 can be a "pseudo-Vss" (PVss) node that is initially charged to a low potential, then allowed to float in a comparison operation to thereby reduce current draw when nodes discharge to one another.

A configuration section 208 can include four controllable impedance paths Tx1 to Tx4 that can selectively connect a corresponding data value line (VL1 to VL4) to a compare input (218-0 or 218-1) according to data values stored in first and second storage cells (204-0 and 204-1). In the example of FIG. 2, each impedance path Tx1 to Tx4 can include an NFET. Impedance path Tx1 has a source-drain path coupled between line VL1 216-0 and first compare input 218-0 and a gate coupled to a receive a data value from node 224-0 of first storage cell 204-0. Impedance path Tx2 has a source-drain path coupled between line VL2 216-1 and first compare input 218-0 and a gate coupled to a receive a second data value from node 224-1, that is the complement of the data value at node 224-0. Impedance path Tx3 has a source-drain path coupled between line VL3 216-2 and second compare input 218-1 and a gate coupled to a receive a first data value from node 226-0 of second storage cell 204-1. Impedance path Tx4 has a source-drain path coupled between line VL4 216-3 and second compare input 218-1 and a gate coupled to a receive a second data value from node 226-1, that is the complement of the data value at node 226-0.

In the example of FIG. 2, a first storage cell 204-0 can have an SRAM cell type structure, including two inverters IN1 and IN2, arranged in a cross-coupled fashion between nodes 224-0 and 224-1, to form one type of a latch. Node 224-0 can be connected to line VL1 216-0 by an access device Tx7. Node 224-1 can be connected to line VL2 216-1 by an access device Tx8. In the embodiment shown, access devices Tx7 and Tx8 can be NFETs. A data value stored by first storage cell 204-0 can be considered a "Y" data value.

A second storage cell 204-1 can have the same general structure as first storage cell 204-0, including cross-coupled inverters IN3 and IN4, and a node 226-0 connected to line VL3 216-2 by an access device Tx9, and a node 226-1 connected to a line VL4 216-3 by an access device Tx10. A data value stored by second storage cell 204-1 can be considered an "X" data value.

The CAM cell 200 of FIG. 2 shows a word line arrangement in which a first word line 228 can be connected to control access devices Tx7 and Tx10, and a second word line 230 can be connected to control access devices Tx8 and Tx9.

Data value lines (216-0 to 216-3) carry different values according to the mode of operation to allow for dynamic configuration between operational modes (binary and ternary).

Referring still to FIG. 2, in a binary compare operation, data value lines 216-0/1 {VL1, VL2} can constitute an application of a first compare data value pair {$CD_1$, $BCD_1$} for comparison to a Y data value stored in first storage cell 2040, while data value lines 216-3/4 {VL3, VL4} can constitute an application of a second compare data value pair {$CD_2$, $BCD_2$} for comparison to an X data value stored in second storage cell 2041. In such a compare operation, data value lines 216-0 to 216-3 {VL1, VL2, VL3, VL4} can be initially forced low, and match line 220 can be precharged high. A node 222 can be precharged low (i.e., lower than match line 220). Subsequently, compare data values $CD_1$/$BCD_1$ and $CD_2$/$BCD_2$ can be driven on data value lines 216-0/1 and 216-3/4. In the event of a MISS compare result (i.e., data value Y≠$CD_1$ or X≠$CD_2$), match line 220 can discharge to node 222. Conversely, in the event of a HIT compare result (i.e., data value Y=$CD_1$ and X=$CD_2$), match line 220 can remain precharged.

In a ternary compare operation, data value lines 216-0/3 {VL1, VL4} can constitute an application of a compare data value pair {CD, BCD} for comparison to a ternary state stored by storage cells 204-0 and 204-1. Data value lines 216-1/2 {VL2, VL3} can constitute lines driven to a predetermined value unrelated to any applied compare data value. In such an operation, data value lines 216-0 to 216-3 {VL1, VL2, VL3, VL4} can be initially forced low, and match line 220 can be precharged high. A node 222 can be precharged low. Subsequently, a compare data values CD/BCD can be driven on data value lines 216-0/3, while a low value can be driven on data value lines 216-1/2. In the event of a MISS compare result (i.e., data value not equal to CD and X/Y both not equal to zero), match line 220 can discharge to node 222. Conversely, in the event of a HIT or MASK compare result (i.e., data value matches CD or X/Y both equal to zero) match line 220 can remain precharged.

In a read operation, word line 228 can be driven high to enable access devices Tx7 and Tx10, and thus place a data value stored in storage cell 204-0 onto value line VL1 and a data value stored in storage cell 204-1 onto value line VL4. Optionally or alternatively, word line 230 can be driven high to enable access devices Tx8 and Tx9, and thus place data values stored in storage cells 204-0/1 onto value lines VL2/3, respectively.

In a write operation, word line 228 can be driven high to enable access devices Tx7 and Tx10, and write data can be driven on value lines VL1 and VL4. In addition, word line 230 can be driven high to enable access devices Tx8 and Tx9, and write data can be driven on value lines VL2 and VL3.

A write operation can also include presetting each storage cell 204-0/1 prior to the application of write data by driving one node of each storage cell to a low voltage. For example, nodes 224-1 and 226-0 can be driven to a low voltage by activating word line 230 while value lines VL2 and VL3 are driven to a low supply voltage Vss. Subsequently, write data can be driven on value lines VL1 and VL4 and written via activation of word line 228. Such an arrangement can address voltage drops introduced by NFET threshold voltages introduced by Tx7/Tx10 and/or Tx8/Tx9. Of course, if such devices were PFETs, a preset operation would force appropriate value lines to a high potential.

It is understood that pseudo-ternary modes of operation can be accommodated by driving "don't care" data values on a value lines, and activating multiple word lines to write such mask data into multiple cells.

The embodiment of FIG. 2, can provide for (i) differential READ and/or WRITE operations to a first and/or second storage cell 204-0 or 204-1; (ii) atomic (single bit) and non-atomic (multiple) writes to X, Y values; (iii) bit maskable writes; (iv) column-wise configuration between binary or ternary operation; and (v) a mask section that provides for single transistor discharge paths for fast discharge of a match line 220.

Figure 3:
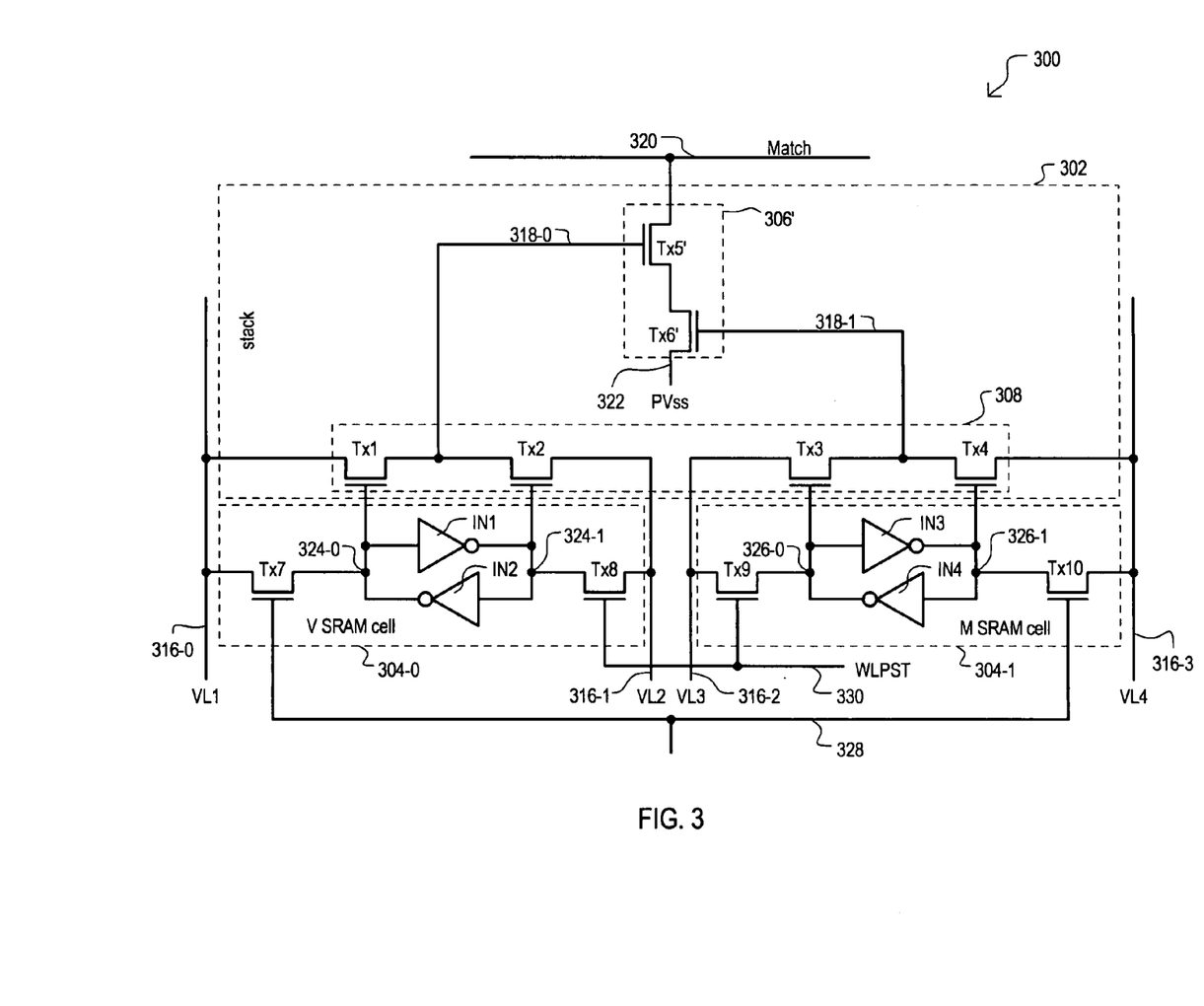
FIG. 3 is a schematic diagram of a configurable CAM cell according to a third embodiment.

A CAM cell according to a third embodiment is shown in FIG. 3 and designated by the general reference character 300. A CAM cell 300 can include some of the same general sections as FIG. 2. Such same sections are referred to by the same reference character, but with the first digit being a "3" instead of a "2".

Unlike the arrangement of FIG. 2, CAM cell 300 of FIG. 3 can be an "M/V" type CAM cell, in which a "don't care" state can be determined by a mask bit M, stored in second storage cell 304-1, rather than a state of two bits.

In addition, a compare section 306' can include controllable impedance paths Tx5' and Tx6' arranged in series with each other. In the example of FIG. 3, impedance path Tx5' can include an NFET having a drain coupled to a match line 320, a source coupled to an impedance path Tx6', and a gate coupled to compare input 318-0. An impedance path Tx6' can include an NFET having a drain coupled to a source of Tx5', a source coupled to discharge node 322, and a gate coupled to compare input 318-1.

A CAM cell 300 can provide either binary or ternary encoding. A binary encoding example is shown in Table III. A ternary encoding example is shown in Table IV.

TABLE III

| V | Value |
|---|---|
| 1 | 1 |
| 0 | 0 |

TABLE IV

| V | M | Value |
|---|---|---|
| 0 | 0 | 0 |
| 1 | 0 | 1 |
| 0/1 | 1 | 0/1 (don't care) |

Data value lines (316-0 to 316-3) carry different values according to the mode of operation to allow for dynamic configuration between operations.

Referring to FIG. 3, in both a binary compare operation and a ternary compare operation, data value lines 316-0/1 {VL1, VL2} can constitute an application of a compare data value pair {CD, BCD} for comparison to a V data value stored in first storage cell 304-0, while data value lines 316-3/4 {VL3, VL4} can constitute lines driven to predetermined values that vary according to the particular mode (binary or ternary).

In a binary compare operation, data value lines 316-0 to 316-3 {VL1, VL2, VL3, VL4} can be initially forced low, match line 320 can be precharged high, and node 322 can be precharged low. Subsequently, a compare data value CD/BCD can be driven on data value lines 316-0/1 while data value lines 316-3/4 can both be driven high. In the event of a MISS compare result (i.e., data value V≠CD), match line 320 can discharge to node 322. Conversely, in the event of a HIT compare result (i.e., data value V=CD), match line 320 can remain precharged.

In a ternary compare operation, data values lines (316-0 to 316-3) can be driven in the same general fashion as a binary compare operation. However, instead of data value lines 316-3/4 both being driven high, such lines can be driven to opposite logic values according to the mask bit storage convention. For example, if node 326-1 stores a value M and node 326-0 stores the complement of such a value (MB), data value line 316-3 can be driven high, while data value line 316-4 can be driven low.

Read and write operations can occur in the same general fashion as the embodiment of FIG. 3. Further, like the embodiment of FIG. 2, pseudo-ternary write operations can be accommodated by driving value lines with a given mask value and activating multiple word lines to write such mask data into multiple locations.

As with the X/Y CAM cell 200 of FIG. 2, a V/M CAM cell 300 like that of FIG. 3 can provide for (i) differential READ and/or WRITE operations; (ii) atomic and non-atomic writes to V and M values; (iii) bit maskable writes; and (iv) column-wise configuration between binary or ternary operation.

Figure 4:
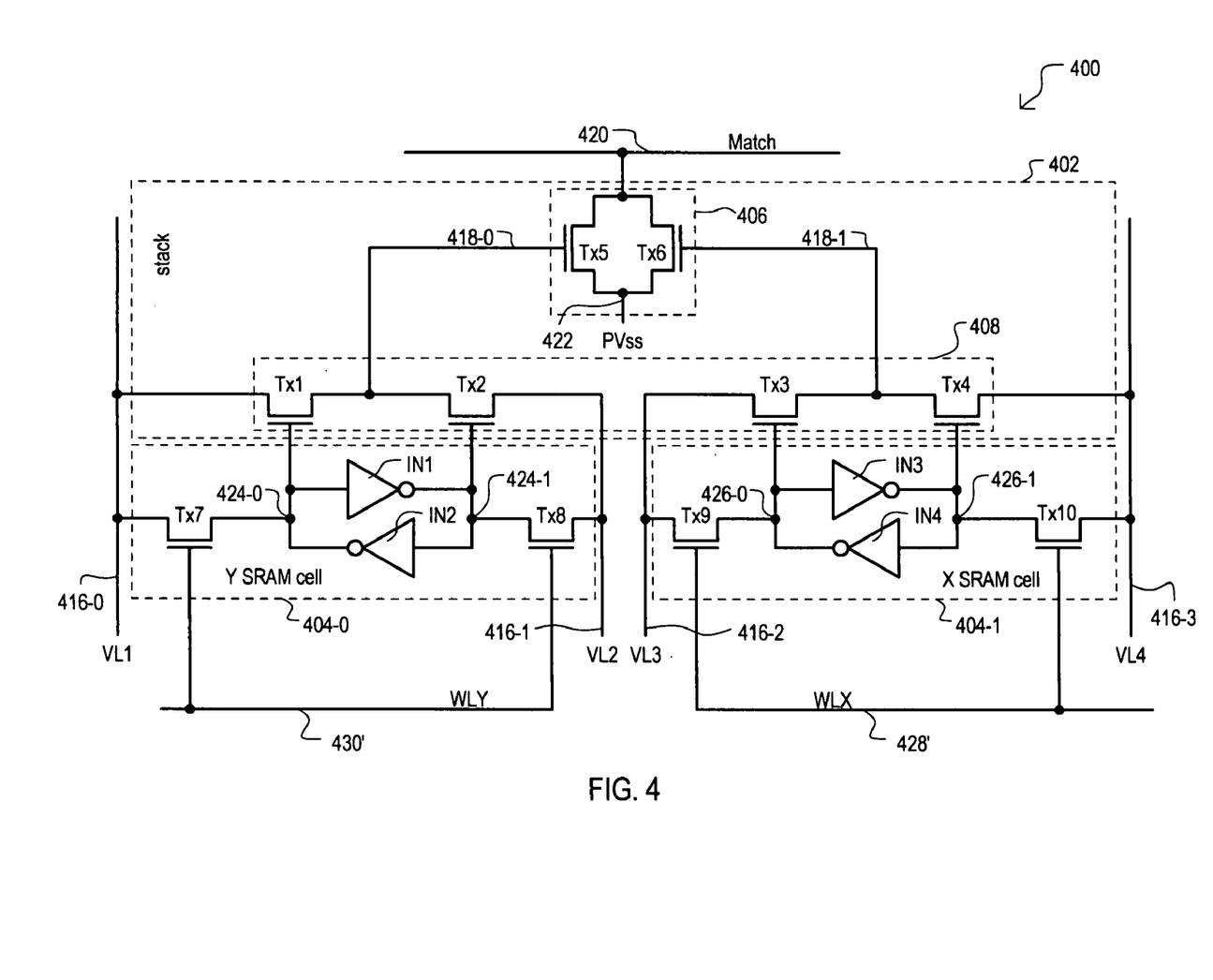
FIG. 4 is a schematic diagram of a configurable CAM cell according to a fourth embodiment.

A CAM cell according to a fourth embodiment is shown in FIG. 4 and designated by the general reference character 400. A CAM cell 400 can include some of the same general sections as FIG. 2. Such same sections are referred to by the same reference character, but with the first digit being a "4" instead of a "2".

FIG. 4 shows an X/Y type CAM cell 400 that can have the same encoding as shown in Tables I and II. CAM cell 400 can differ from that of FIG. 2 in that each storage cell 402-0 and 402-1 can be accessed via a corresponding word line 428' and 430', respectively.

Binary and ternary compare operations for CAM cell 400 can occur in the same fashion as the CAM cell of FIG. 2.

In a read operation, a word line 430' can be driven high to enable access devices Tx7 and Tx8, and thus place a data value stored in storage cell 204-0 onto value lines VL1 and VL2 (e.g., X and XB). In addition, or alternatively, a word line 428' can be driven high to enable access devices Tx9 and Tx10, and thus place a data value stored in storage cell 404-1 onto value lines VL3 and VL4 (e.g., Y and YB).

In a write operation, word line 428' can be driven high to enable access devices Tx7 and Tx8, and write data can be driven on value lines VL1 and VL2. In addition, word line 430' can be driven high to enable access devices Tx9 and Tx10, and write data can be driven on value lines VL3 and VL4.

In this way, read and write accesses can be more "granular", enabling writes to specific storage cells, rather than both storage cells simultaneously.

Figure 5:
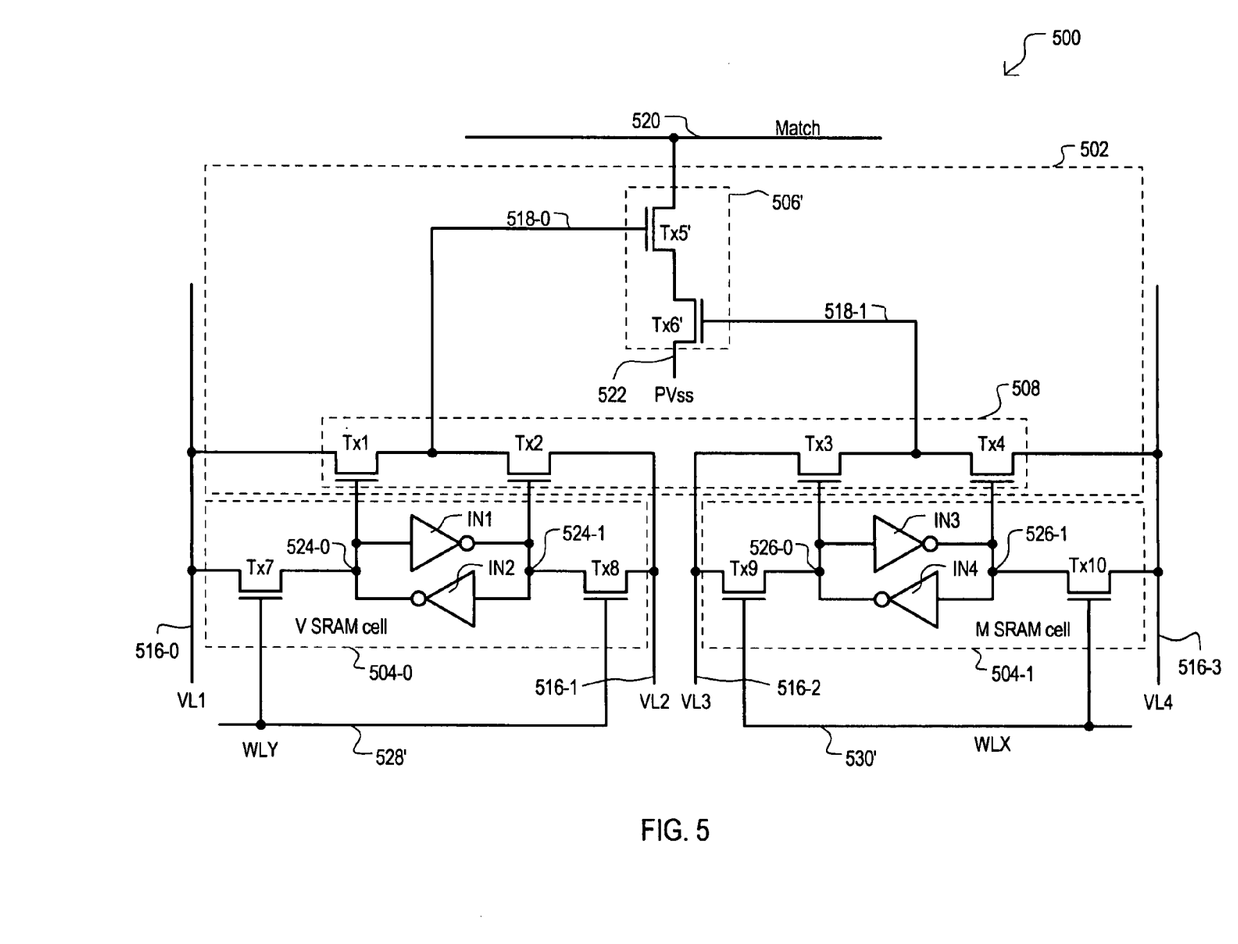
FIG. 5 is a schematic diagram of a configurable CAM cell according to a fifth embodiment.

A CAM cell according to a fifth embodiment is shown in FIG. 5 and designated by the general reference character 500. A CAM cell 500 can include some of the same general sections as FIG. 3. Such same sections are referred to by the same reference character, but with the first digit being a "5" instead of a "3".

FIG. 5 shows a V/M type CAM cell 500 that can have the same encoding as shown in Tables III and IV. CAM cell 500 can differ from that of FIG. 3 in that each storage cell 502-0 and 502-1 can be accessed via a corresponding word line 528' and 530', respectively.

Binary and ternary compare operations for CAM cell 500 can occur in the same fashion as the CAM cell of FIG. 3.

Read and write operation for the CAM cell 500 can occur in the same general fashion as described for FIG. 4, above. A word line 528' can be driven high to access storage cell 502-0, which can store a value V, and word line 530' can be driven high to access storage cell 502-1, which can store a mask value M.

Figure 6:
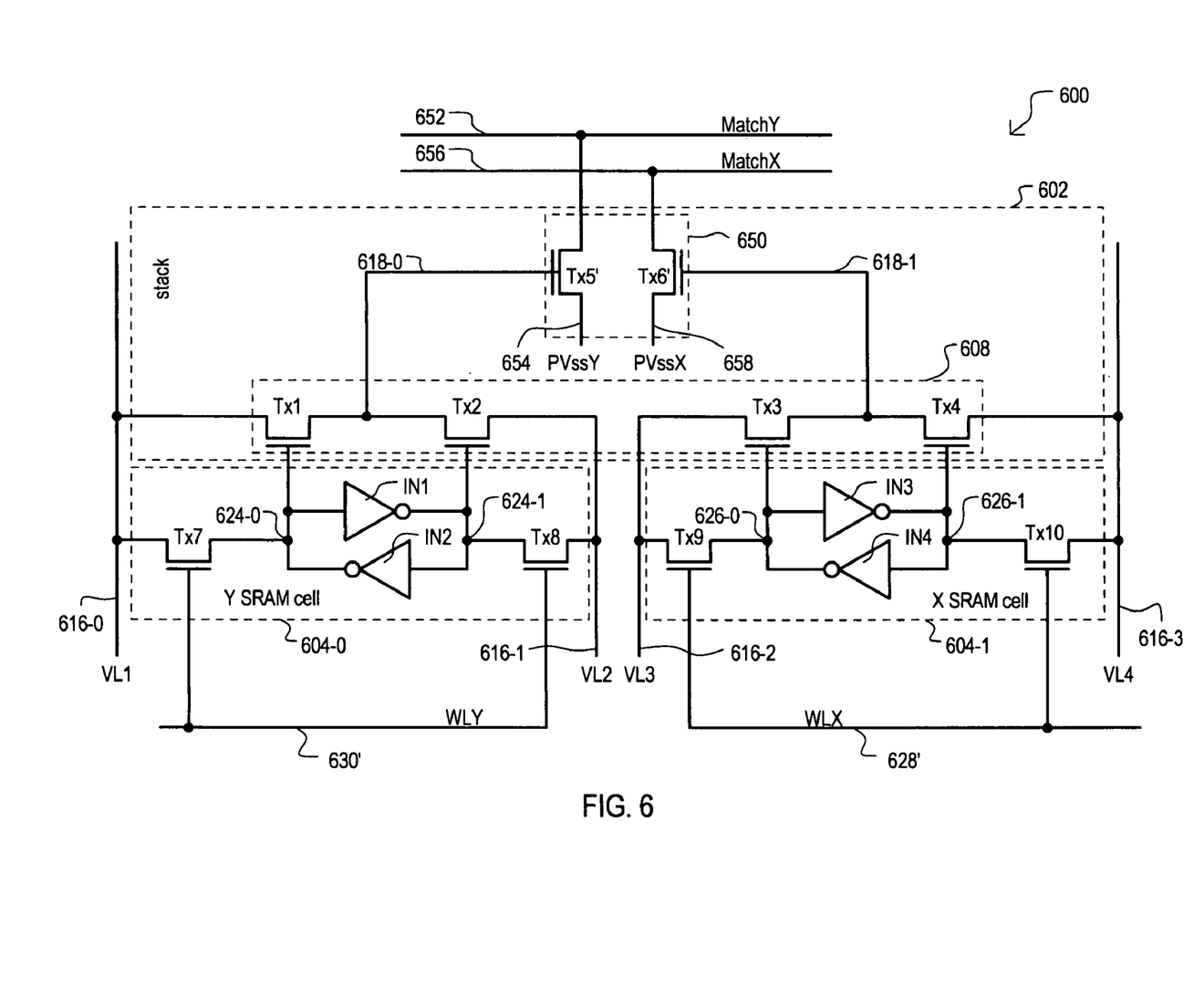
FIG. 6 is a schematic diagram of a configurable CAM cell according to a sixth embodiment.

A CAM cell according to a sixth embodiment is shown in FIG. 6 and designated by the general reference character 600. A CAM cell 600 can include some of the same general sections as FIG. 4. Such same sections are referred to by the same reference character, but with the first digit being a "6" instead of a "4".

FIG. 6 shows an X/Y type CAM cell 600 that can have the same encoding as shown in Tables I and II. CAM cell 600 can differ from that of FIG. 4 in that a compare section 650 can include a controllable impedance path Tx5' connected between a first match line 652 and a first discharge node 654 that is controlled according to a first compare input 618-0, as well as a controllable impedance path TX6' connected between a second match line 656 and a second discharge node 658 that is controlled according to a second compare input 618-1.

In a binary compare operation, data value lines 616-0/1 {VL1, VL2} can constitute an application of a first compare data value pair {CD$_1$, BCD$_1$} for comparison to a Y data value stored in first storage cell 604-0, while data value lines 616-3/4 {VL3, VL4} can constitute an application of a second compare data value pair {CD$_2$, BCD$_2$} for comparison to an X data value stored in second storage cell 604-1. In such an operation, data value lines 616-0 to 616-3 {VL1, VL2, VL3, VL4} can be initially forced low, and match lines 652 and 656 can be precharged high. Nodes 654 and 658 can be precharged low. Subsequently, compare data values CD$_1$/BCD$_1$ and CD$_2$/BCD$_2$} can be driven on data value lines 616-0/1 and 616-3/4.

In the event of a MISS compare result for value Y (i.e., data value Y≠CD$_1$), match line 652 can discharge to node 654. Conversely, in the event of a HIT compare result (i.e., data value Y=CD$_1$), match line 652 can remain precharged. Similarly, in the event of a MISS compare result for value X (i.e., data value X≠CD$_2$), match line 656 can discharge to node 658. Conversely, in the event of a HIT compare result (i.e., data value X=CD$_2$), match line 656 can remain precharged.

In this way, a CAM cell 600 can provide separate binary matching capabilities for stored (X and Y) data values. As a result, a match line 652 can represent a binary compare operation for "Y" data values in a CAM row, while match line 656 can represent a binary compare operation for "X" data values in a row. Such values can thus be separate match results, or can be logically combined (e.g., ANDed or NANDed) to represent a larger compare operation of all stored bits (X and Y) within such a row.

In a ternary compare operation, data value lines 616-0/3 {VL1, VL4} can constitute an application of a compare data value pair {CD, BCD} for comparison to a ternary state stored by storage cells 604-0 and 604-1. Data value lines 616-1/2 {VL2, VL3} can constitute lines driven to a predetermined value unrelated to any applied compare data value. In such an operation, data value lines 616-0 to 616-3 {VL1, VL2, VL3, VL4} can be initially forced low, and match lines (652 and 656) can be precharged high. Node 654 and 658 can be precharged low. Subsequently, a compare data value CD/BCD can be driven on data value lines 616-0/3, while a low value can be driven on data value lines 616-1/2. In the event of a MISS compare result (i.e., data value not equal to CD and X/Y both not equal to zero), match line 652 or 656 can discharge. Conversely, in the event of a HIT (or MASK) compare result (i.e., data value matches CD or X/Y both equal to zero) both match lines 652 or 656 can remain precharged.

Read and write operations can occur as described for CAM cell 400 of FIG. 4.

Figure 7:
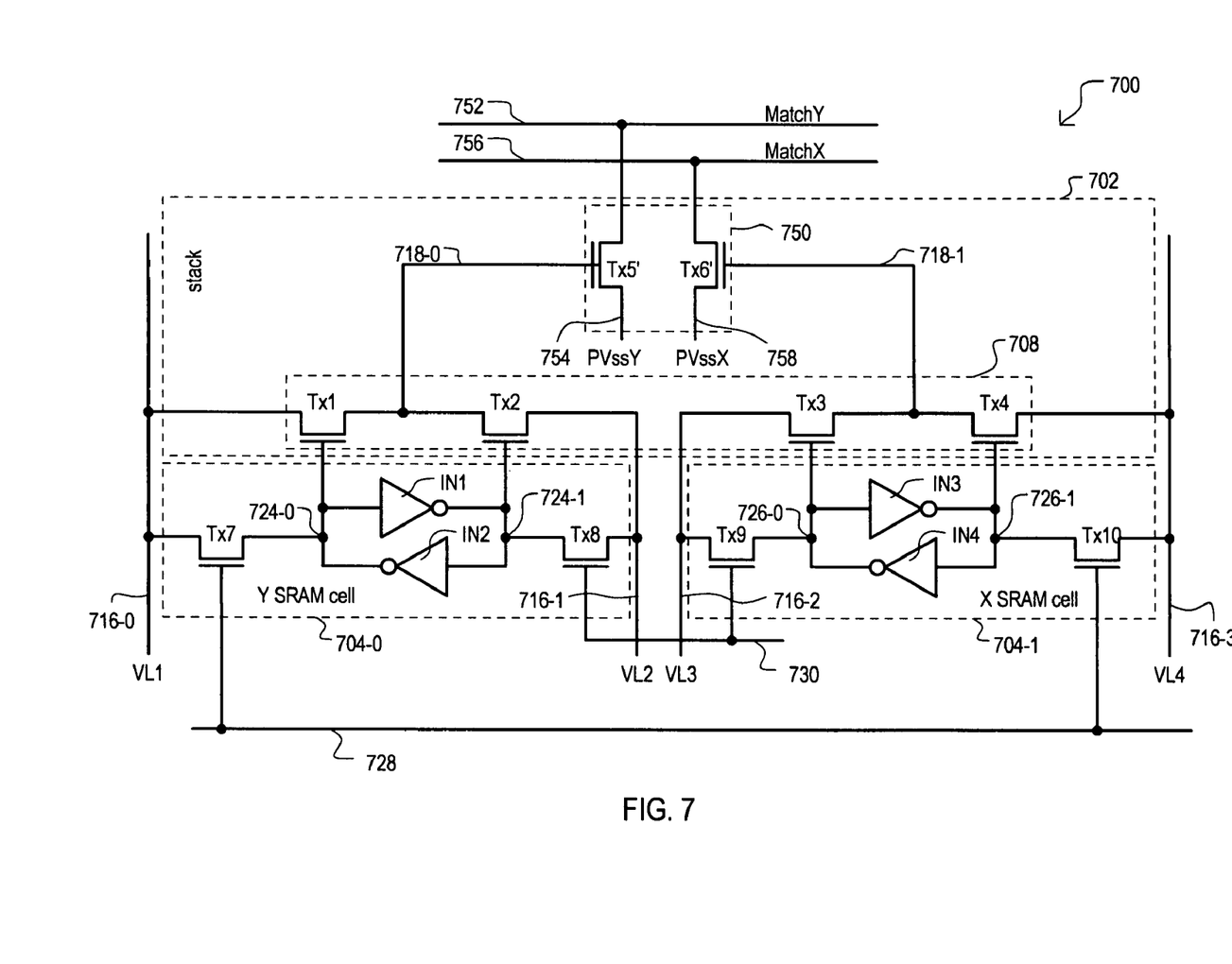
FIG. 7 is a schematic diagram of a configurable CAM cell according to a seventh embodiment.

A CAM cell according to a seventh embodiment is shown in FIG. 7 and designated by the general reference character 700. A CAM cell 700 can include some of the same general sections as FIG. 6. Such same sections are referred to by the same reference character, but with the first digit being a "7" instead of a "6".

FIG. 7 shows an X/Y type CAM cell 700 that can have the same encoding as shown in Tables I and II. CAM cell 700 can differ from that of FIG. 6 in that word lines 728 and 730 can be arranged as show in FIG. 2.

Binary and ternary compare operations can occur as described above in FIG. 6. Read and write operations can occur as described above in FIG. 2.

Figure 8:
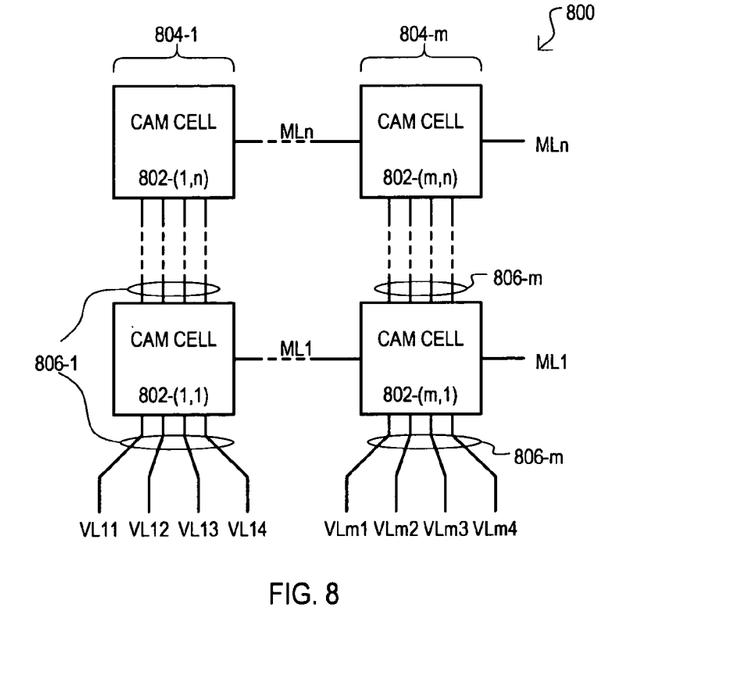
FIG. 8 is a schematic diagram of a CAM device according to an eighth embodiment.

Referring now to FIG. 8, a CAM device according to one embodiment is set forth in block schematic diagram and designated by the general reference character 800. A CAM device 800 can include a number of CAM cells arranged into an array, four of which are shown as 802-(1,1) to 802-(m,n). Each CAM cell of the array can have any of the structures shown in the various embodiments described above. CAM cells of each column of the array can be commonly connected to four data value lines. Thus, in FIG. 8, CAM cells of column 804-1 can be commonly connected to data value line set 806-1 (VL11, VL12, VL13, VL14), while CAM cells of column 804-m can be commonly connected to data value line set 806-m (VLm1, VLm2, VLm3, VLm4).

In an arrangement like that of FIG. 8, binary or ternary operation can be established by driving data value lines. In this way, a CAM device 800 can be configurable between binary and ternary modes of operation on a column-wise basis.

It is understood that in any of the above embodiments represent very particular implementations of a CAM cell, and thus should not be construed as limiting to the present invention. For example, while particular compare circuits are described, other embodiments can include different types of compare circuits. Further, the particular storage cells described should not be construed as limiting to the invention.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) cell circuit, comprising:
   a stack section that includes
      a compare circuit that controls at least one impedance path coupled to at least one match line in response to a first compare input and a second compare input, and
      a configuration circuit that includes a first switching device that couples a first data value line to the first compare input in response to a stored first data value, and a second switching device that couples a second data value line to the first compare input in response to a stored complementary first data value, a third switching device that couples a third data value line to the second compare input in response to a stored second data value, and a fourth switching device that couples a fourth data value line to the second compare input in response to a stored complementary second data value; and
   pairs of data value lines being driven according to different complementary compare data values in a binary mode of operation, and one pair of data value lines being driven to complementary compare data values and the other pair of value lines being driven to at least one predetermined potential, unrelated to a compare data value, in a ternary mode of operation.

2. The CAM cell circuit of claim 1, wherein:
the first, second, third and fourth switching devices comprise insulated gate field effect transistors having gates coupled to the stored complementary first data value, stored first data value, stored second data value, and stored complementary data value, respectively.

3. The CAM cell circuit of claim 1, further including:
the compare circuit comprises a first controllable current path coupled between one match line and a discharge node and controlled according to the first compare input, and a second controllable current path coupled between the one match line and the discharge node and controlled according to the second compare input.

4. The CAM cell circuit of claim 1, wherein:
the compare circuit comprises a first discharge current path coupled between one match line and a discharge node and controlled according to the first compare input, and a second discharge current path in series with the first discharge current path between the one match line and the discharge node and controlled according to the second compare input.

5. The CAM cell circuit of claim 1, wherein:
the compare circuit comprises a first controllable current path coupled between a first match line and a first discharge node and controlled according to the first compare input, and a second controllable current path coupled between a second match line and a second discharge node and controlled according to the second compare input.

6. The CAM cell circuit of claim 1, wherein:
the first data value line is coupled to receive a complementary first comparand value in the binary mode of operation and driven to a comparand value in the ternary mode of operation;
the second data value line is coupled to receive a first comparand value in the binary mode of operation and driven to a first logic value in the ternary mode of operation;
the third data value line is coupled to receive a complementary second comparand value in the binary mode of operation and driven to the first logic value in the ternary mode of operation; and
the fourth data value line is coupled to receive a second comparand value in the binary mode of operation and driven to a complementary comparand value in the ternary mode of operation.

7. The CAM cell circuit of claim 1, wherein:
the first data value line is coupled to receive a complementary first comparand value in the binary mode of operation and driven to a comparand value in the ternary mode of operation;
the second data value line is coupled to receive a first comparand value in the binary mode of operation and driven to a complementary comparand value in the ternary mode of operation;
the third data value line is coupled to receive a first logic value in the binary mode of operation and driven to the first logic value in the ternary mode of operation; and
the fourth data value line is coupled to receive the first logic value in the binary mode of operation and driven to a second logic value in the ternary mode of operation.

8. The CAM cell circuit of claim 1, further including:
a first storage circuit that provides the stored first data value and the stored complementary first data value; and
a second storage circuit that provides the stored second data value and the stored complementary second data value.

9. The CAM cell circuit of claim 8, further including:
a first access device coupled between the first data value line and a first storage node of the first storage circuit;
a second access device coupled between the second data value line and a second storage node of the first storage circuit;
a third access device coupled between the third data value line and a first storage node of the second storage circuit; and
a fourth access device coupled between the fourth data value line and a second storage node of the second storage circuit;
the impedance of the first and fourth access devices being controlled according to a first word line; and
the impedance of the second and third access devices being controlled according to a second word line.

10. The CAM cell circuit of claim 8, further including:
a first access device coupled between the first data value line and a first storage node of the first storage circuit;
a second access device coupled between the second data value line and a second storage node of the first storage circuit;
a third access device coupled between the third data value line and a first storage node of the second storage circuit; and
a fourth access device coupled between the fourth data value line and a second storage node of the second storage circuit;
the impedance of the first and second access devices being controlled according to a first word line; and
the impedance of the third and fourth access devices being controlled according to a second word line.

11. A binary/ternary dynamically configurable content addressable memory (CAM) cell comprising:
a pair of memory cells adapted to store bits of data compared within an operation stack against comparand data supplied via compare data and complementary compare data inputs; and
the operation stack comprising
match means for enabling a discharge path between at least one match line and a predetermined potential, the match means enables a discharge path between a first match line and a first discharge node and a discharge path between a second match line and a second discharge node, and
configure means for configuring the CAM cell for either binary or ternary operation.

12. The CAM cell of claim 11, wherein:
the match means comprises a first group of transistors having source-drain paths coupled between the at least one match line and the predetermined potential; and
the configure means comprises a second group of transistors having source-drain paths coupled to data storage nodes of the pair of memory cells.

13. The CAM cell of claim 11, wherein:
the pair of memory cells comprise static random access memory cells.

14. The CAM cell of claim 11, further including:
a first word line that enables access to one data node of each memory cell; and a second word line that enables access to one data node of each memory cell different from the data nodes accessed by the first word line.

15. The CAM cell of claim 11, further including:
a first word line that enables access to complementary data nodes of a first memory cell of the memory cell pair; and
a second word line, that enables access to complementary data nodes of a second memory cell of the memory cell pair.

16. A content addressable memory (CAM) device, comprising:
a CAM array comprising a plurality of CAM cell circuits arranged into rows and columns, each column being coupled to a different set of four data value lines; and
each CAM cell circuit providing a binary mode of operation in response to two complementary data values provided on the set of four data value lines coupled to the CAM cell, and providing a ternary mode of operation in response to a complementary data value provided on two of the four data value lines and predetermined potentials on the other two of the four data value lines.

17. The CAM device of claim 16, wherein:
each CAM cell circuit provides a ternary mode of operation that forces a predetermined match result in response to two data bit values stored in the CAM cell circuit and a complementary data value provided on two of the four data value lines and a predetermined potential on the remaining two data value lines.

18. The CAM device of claim 16, wherein:
each CAM cell circuit provides a ternary mode of operation that forces a predetermined match result in response to only one data bit value stored in the CAM cell circuit and a complementary data value provided on two of the four data value lines and two different predetermined potentials on the remaining two data value lines.

19. The CAM device of claim 16, wherein:
each CAM cell circuit comprises two storage cells, accessible according to an arrangement selected from the group consisting of activating a word line to access both storage cells of each CAM circuit of the same row simultaneously, and activating one word line to access a first storage cell of each CAM circuit of the same row simultaneously, and activating a second word line to access a second storage cell of each CAM circuit of the same row simultaneously.

* * * * *

UNITED STATES PATENT AND TRADEMARK OFFICE
CERTIFICATE OF CORRECTION

PATENT NO. : 7,324,362 B1  
APPLICATION NO. : 11/366040  
DATED : January 29, 2008  
INVENTOR(S) : Dinesh Maheshwari It is certified that error appears in the above-identified patent and that said Letters Patent is hereby corrected as shown below:

At column 3, line 29, please replace "1040" with -- 104-0 -- so that the corresponding phrase reads – a first storage cell 104-0 –.

At column 5, line 63, please replace the second "2040" with -- 204-0 -- so that the corresponding phrase reads – first storage cell 204-0 –.

At column 5, line 66, please replace the second "2041" with -- 204-1 -- so that the corresponding phrase reads – second storage cell 204-1 –.

Signed and Sealed this

Seventeenth Day of June, 2008

JON W. DUDAS  
*Director of the United States Patent and Trademark Office*